United States Patent [19]

Verstraete

[11] Patent Number: 4,962,458

[45] Date of Patent: Oct. 9, 1990

[54] ROUTE PLANNER DEVICE

[75] Inventor: Rik A. Verstraete, Kontich, Belgium

[73] Assignee: U.S. Philips Corporation, New York, N.Y.

[21] Appl. No.: 236,500

[22] Filed: Aug. 25, 1988

[30] Foreign Application Priority Data

Aug. 28, 1987 [NL] Netherlands .......................... 8702014

[51] Int. Cl.$^5$ ............................................. G06F 15/50
[52] U.S. Cl. .................................... 364/443; 364/444; 73/178 R
[58] Field of Search ....................... 364/443, 444, 449; 73/178 R; 340/988, 990, 995

[56] References Cited

U.S. PATENT DOCUMENTS

| 4,570,227 | 2/1986 | Tachi et al. | 340/995 |
| 4,796,189 | 1/1989 | Nakayama et al. | 340/990 |
| 4,796,191 | 1/1989 | Honey et al. | 364/449 |

OTHER PUBLICATIONS

M. Sugie et al., "CAR Guide-on-Board Computer for Automobile Route Guidance", AFIPS: Conf. Proc. (Las Vegas, 1984), pp. 695-706.

E. Dikstra, "A Note on Two Problems in Comnexion with Graphs", Numenische Mathematic, 1, 269-271 (1959).

*Primary Examiner*—Gary Chin
*Attorney, Agent, or Firm*—Anne E. Barschall

[57] ABSTRACT

A route planner comprises a control unit, a working memory and a storage memory in which a topological road network is stored in the form of at least one n-cell table. For the planning of a route between a starting point and a destination point a set of candidate cells is searched each time on the basis of an expansion index which indicates and n-cell, a further expansion index being derived from said set of candidate cells. For the storage of information blocks for each of the candidate cells found, a memory location is reserved in the memory working memory for each n-cell associated with an n-cell table used for the planning of the route. The information block of a candidate cell comprises inter alia the expansion index used to find the candidate cell and is stored at the memory location reserved for the relevant candidate cell. The sequence of the reserved memory locations preferably correspond to the sequence used to represent the n-cells in the table.

17 Claims, 8 Drawing Sheets

|   | + | | | | | − | | | | |
|---|---|---|---|---|---|---|---|---|---|---|
|   | KAV | n-cl | DIR | G | H | KAV | n-cl | DIR | G | H |
| f x y z | | | | | | | | | | |
FIG.3
|    |        | KAV | 0 cel | G  | H  |
|----|--------|-----|-------|----|----|
| 1  | a,c,b, | *   | *     | 0  | 25 |
| 2  | d,e,h, | A   | 3     | 40 | 0  |
| 3  | c,f,g,e, | A | 1     | 20 | 20 |
| 11 | a      | A   | 1     | 20 | 35 |
| 12 | d      |     |       |    |    |
| 21 | b      | A   | 1     | 60 | 60 |
| 22 | f      | A   | 3     | 60 | 80 |
| 24 | g      | A   | 3     | 50 | 80 |
| 25 | h      |     |       |    |    |
FIG.8
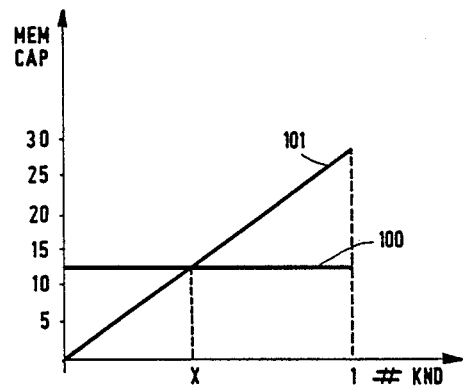
FIG.10
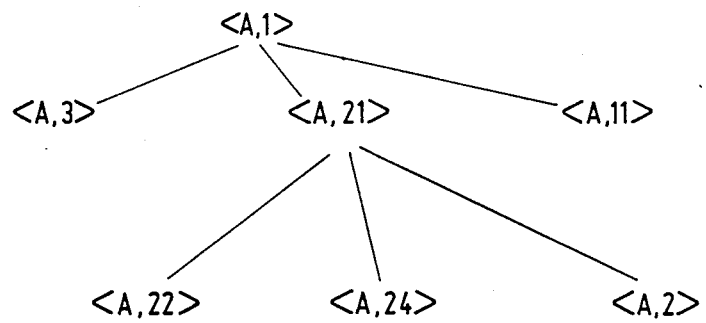
FIG.9

|   | ND BP | | ND EP | | + | | | | | − | | | | |
|---|---|---|---|---|---|---|---|---|---|---|---|---|---|---|
|   | 0-cel | t.p. | 0-cel | t.p. | KAV | 1-cel | DIR | G | H | KAV | 1-cel | DIR | G | H |
| a | 11 | a,− | 1 | b,A | * | * | * | 0 | 85 | A | a | + | 20 | 105 |
| b | 1 | c,A | 21 | b,− | A | a | + | 60 | 100 | | | | | |
| c | 1 | a,A | 3 | f,A | A | a | + | 20 | 70 | A | c | + | 40 | 90 |
| d | 12 | d,− | 2 | e,A | | | | | | A | e | − | 50 | 80 |
| e | 2 | h,A | 3 | c,A | A | e | − | 60 | 70 | A | c | + | 30 | 80 |
| f | 3 | g,A | 22 | f,B | A | c | + | 60 | 90 | | | | | |
| g | 3 | c,A | 24 | c,C | A | c | + | 40 | 55 | | | | | |
| h | 2 | d,A | 25 | h,C | A | e | − | 75 | 35 | | | | | |
| j | 13 | j,− | 4 | h,C | | | | | | C | k | − | 105 | 20 |
|   |    |     |   |     | | | | | | C | h | + | 100 | 20 |
| k | 4 | m,C | 10 | g,C | C | k | − | 100 | 40 | C | g | + | 80 | 25 |
|   |   |     |    |     | C | h | + | 95 | 40 | | | | | |
| l | 14 | l,− | 5 | m,C | | | | | | C | m | + | 125 | 20 |
| m | 4 | j,C | 5 | n,C | C | k | − | 110 | 5 | C | m | + | 145 | 20 |
|   |   |     |   |     | C | h | + | 105 | 5 | | | | | |
| n | 5 | p,C | 27 | n,D | C | m | + | 135 | 30 | | | | | |
| p | 5 | l,C | 15 | p,− | C | m | + | 110 | 0 | | | | | |
| q | 24 | g,A | 10 | w,C | A | g | + | 60 | 40 | C | g | + | 70 | 55 |
| w | 10 | k,C | 26 | w,D | C | g | + | 80 | 45 | | | | | |
| h | 25 | h,A | 4 | k,C | A | h | + | 85 | 25 | C | k | − | 95 | 30 |
|   |    |     |   |     | | | | | | C | h | + | 90 | 30 |

FIG. 6

| 1-cel | begin | | eind | |
|---|---|---|---|---|
| | 0-cel | t.p | 0-cel | t.p |
| a | 11 | a,- | 1 | b,A |
| b | 1 | c,A | 21 | b,- |
| c | 1 | a,A | 3 | f,A |
| d | 12 | d,- | 2 | e,A |
| e | 2 | h,A | 3 | c,A |
| f | 3 | g,A | 22 | f,B |
| g | 3 | e,A | 24 | g,C |
| h | 2 | d,A | 25 | h,C |

FIG.11

| f | 22 | f,A | 9 | z,B |
|---|---|---|---|---|
| x | 23 | x,D | 9 | :,B |
| y | 9 | x,B | 19 | :,- |
| z | 9 | y,B | 20 | z,- |

FIG.12

| j | 13 | j,- | 4 | h,C |
|---|---|---|---|---|
| k | 4 | m,C | 10 | g,C |
| l | 14 | l,- | 5 | m,C |
| m | 4 | j,C | 5 | n,C |
| n | 5 | p,C | 27 | n,D |
| p | 5 | l,C | 15 | p,- |
| q | 24 | g,A | 10 | w,C |
| w | 10 | k,C | 26 | w,D |
| h | 25 | h,A | 4 | k,C |

FIG.13

| w | 26 | w,C | 8 | :,D |
|---|---|---|---|---|
| n | 27 | n,C | 6 | :,D |
| x | 8 | s,D | 23 | :,B |
| r | 6 | t,D | 8 | ..D |
| s | 8 | r,D | 7 | ..D |
| t | 6 | q,D | 7 | :.D |
| q | 6 | n,D | 16 | :.- |
| u | 7 | v,D | 18 | ..- |
| v | 7 | t,D | 17 | ..- |

FIG.14

| O-cel | thread pointer | |
|---|---|---|
| 1 | a,b,c | A |
| 2 | d,e,h | A |
| 3 | c,f,g,e | A |
| 11 | a | - |
| 12 | d | - |
| 21 | b | - |
| 22 | f | B |
| 24 | g | C |
| 25 | h | C |

FIG. 15a

| O-cel | thread pointer | |
|---|---|---|
| 9 | f,x,y,z | B |
| 19 | y | - |
| 20 | z | - |
| 22 | f | A |
| 23 | x | D |

FIG. 15b

| O-cel | thread pointer | |
|---|---|---|
| 4 | h,j,k,m | C |
| 5 | m,n,p,l | C |
| 10 | g,k,w | C |
| 13 | j | - |
| 14 | l | - |
| 15 | p | - |
| 24 | g | A |
| 25 | h | A |
| 26 | w | D |
| 27 | n | D |

FIG. 15c

| O-cel | thread pointer | |
|---|---|---|
| 6 | n,q,t,r | D |
| 7 | s,t,u,v | D |
| 8 | w,r,s,x | D |
| 16 | q | - |
| 17 | v | - |
| 18 | u | - |
| 23 | x | B |
| 26 | w | C |
| 27 | n | C |

FIG. 15d

ROUTE PLANNER DEVICE

BACKGROUND TO THE INVENTION

The invention relates to a planner device for planning a route through a topological road network, comprising:

background memory means for storing said network as a set of n-cell tables (n=0, 1) of road segments or junctions;

random access working memory means coupled to the background memory means, for storing a subset of said set of n-cell tables as actually used in said planning address assigning means for assigning a first working memory address to each entry of each n-cell table used in planning the route; data processing means coupled to said working memory means comprising:

expansion means for pointing to a set of candidate n-cells for said route, starting from one end of the route until the other end of the route is reached, on the basis of an actual expansion index indicating an actual n-cell;

evaluation means for assigning an evaluation value to each candidate n-cell found;

selection means for selecting an actual candidate n-cell having the most advantageous evaluation value among those that have not led to an expansion index, for therefrom generating a next actual expansion index, and repeat control means for repeatedly activating said expansion means, said evaluation means and said selection means until the other end of said route is reached, and backtracking means activated by said repeat control means for backtracking a linked set of candidates then starting from the n-cell containing said other end until said one end is reached, said linked set constituting said route.

EXEMPLARY PRIOR ART

Such a device is known from "CAR Guide-on-board computer for automobile route guidance" by M. Sugui et al., AFIPS Conference Proceedings, 1984 National Computer Conference (July 9-12, 1984, Las Vegas, Nevada), pages 695-706. The topology of the road network is stored in the background memory in a set of n-cell tables. The junctions of the roads are represented by 0-cells and the road segments between two junctions are represented by 1-cells. When a route is to be planned a first expansion index is formed on the basis of the starting point or the destination point. This first expansion index indicates either the 1-cell at which the starting point or destination point is situated, or the 0-cell situated nearest to that point, depending on whether a route is planned on the basis of 1-cells or 0-cells. From the first expansion index a set of candidate cells is found for example, by means of thread pointers which are also stored in the n-cell table. A thread pointer indicates a further n-cell which has a predetermined relation with the first n-cell. For each candidate cell an evaluation value is determined as an estimate of the usability of the candidate cell in finding an optimum route. From the set of candidate cells the candidate cell having the best evaluation value is selected for forming a further expansion index. The operation is repeated until the n-cell containing the other end point of the route is found. Each time, the expansion index is selected from those candidate cells that have not yet led to an expansion index. All expansion indices then form a further set wherefrom the n-cells forming the planned route can be derived For each candidate cell found the address generator forms a working memory address at which inter alia the expansion index used to find the candidate cell is stored.

It is a drawback of the known device that the information (inter alia the expansion index) for the candidate cells found is stored at successive memory locations. The address generation thus requires a suitable bookkeeping system in which it is memorized where the information for the various candidate cells is stored in order to enable, after all candidate cells have been found and stored in the working memory, the selection of the various n-cells forming the planned route. This is because, upon selection of the expansion indices from said further set, it is important to know where the n-cell indicated for a selected expansion index is stored. Thus, memory space as well as processing time will be required for the bookkeeping system indicating where the various candidate cells are stored.

SUMMARY OF THE INVENTION

Among other things, it is an object of the present invention to provide a device in which said bookkeeping system is much simpler and requires substantially less processing time.

According to a first aspect, the invention is characterized in that said working memory means has address assigning means for assigning a first working memory address to each entry of any n-cell table used in planning the route, and linking means for linking each first memory pertaining to a candidate cell pointed to by said expansion means, to a second working memory address containing the n-cell used for said pointing.

The memory address for each n-cell associated with an n-cell table used for the planning of the route unambiguously defines the address at which the information for a candidate cell is to be stored, so that the bookkeeping system for the addresses will be very simple. Furthermore, when at the addresses reserved for the various candidate cells relating to the same expansion index there is each time stored the latter expansion index, the memory location where the various expansion indices are to be stored is also unambiguously defined. By using this systematic assignment of addresses, it becomes very simple to fetch the expansion indices selected from said further set in that each expansion index indicates an n-cell whose address is unambiguously defined.

FURTHER ASPECTS OF THE INVENTION

According to a second aspect in which the n-cell tables are ordered in a predetermined sequence, the address generator is preferably suitable for maintaining the ordering according to the same predetermined sequence during the formation of working memory addresses for the n-cells of an n-cell table used.

In a further preferred embodiment of a device in accordance with the invention, in which the n-cell table is a 1-cell table in which a direction is assigned to each 1-cell and in which the expansion index also contains a direction of travel, the address generator is preferably suitable for forming, for each 1-cell of a said 1-cell table used, a working memory address for a first and a second memory location, respectively, the route planner comprising a detection unit which is connected to the address generator in order to detect whether the direction of travel as indicated by the expansion index corresponds to the direction assigned to the candidate 1-cell, which address generator is also suitable for assigning to the expansion index, in the case of correspondence and non-correspondence, respectively, of the direction of travel, the first and the second working memory location, respectively, formed the candidate 1-cell. Because a 1-cell can usually be traversed in two directions, a memory location is thus reserved for each travel direction without affecting the systematic nature of the assignment of addresses.

Preferably, for fetching the expansion indices from said further set the address generator is adapted for forming, for each expansion index, the address assigned to the n-cell indicated by said expansion index. The addresses for the memory locations at which the expansion indices which indicate the n-cells of the ultimately planned route can thus be simply generated.

Preferably, the address generator is suitable for assigning to each information block the working memory address assigned to the expansion index included in the respective information block, an information block replacing a further information block stored at the assigned working memory address if the further information block has a cumulative resistance value which is higher than that contained in said information block. Information blocks which would lead to a less attractive route are thus erased and, storage space is saved.

BRIEF DESCRIPTION OF THE FIGURES

The invention will be described in detail hereinafter with reference to the drawings; therein

FIG. 3 shows the contents of a part of the working memory;

FIG. 6 shows contents of the working memory containing information blocks of a route planned on the basis of 1-cells;

FIG. 8 shows a second example of the content of the working memory on the basis of 0-cells;

FIG. 9 shows a tree structure of the parent pointers for the second example;

FIG. 10 shows a graph illustrating the use of the working memory.

FIG. 11 is a table which will be referred to herein as TABLE I.

FIG. 12 is a table which will be referred to herein as TABLE II.

FIG. 13 is a table which will be referred to herein as TABLE III.

FIG. 14 is a table which will be referred to herein as TABLE IV.

FIG. 15a is a table which will be referred to herein as TABLE Va.

FIG. 15b is a table which will be referred to herein as TABLE Vb.

FIG. 15c is a table which will be referred to herein as TABLE Vc.

FIG. 15d is a table which will be referred to herein as TABLE Vd.

DESCRIPTION OF A PREFERRED EMBODIMENT

Figure 1:
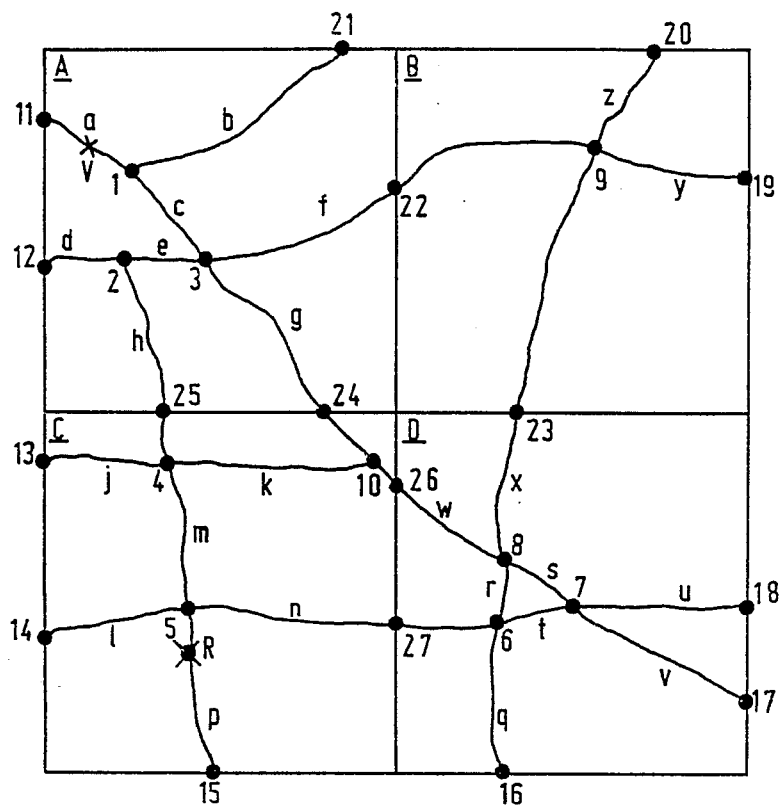
FIG. 1 shows an example of a topological network.

FIG. 1 shows an example of a topological road network that is used in a vehicle navigation system. Other topological networks may relate to a city map or to a telephone network. The network contains four sections A, 8, C, D. The digits 1, 2, ..., 27 indicate junctions or section boundaries and the letters a, b, c, ..., y, z indicate road segments interconnecting two junctions. For example, road segment e interconnects the junctions 2 and 3. Further, a starting point and a terminating point are also given to each road segment. For example, junction 1 is the starting point for the road segment c and junction 3 is the terminating point thereof. The assignment of starting points and terminating points will be described hereinafter. Junctions are denoted as 0-cells and road segments are denoted as 1-cells. An area enclosed by road segments forms a 2-cell. Such a network is stored in a digital background memory, such as an optical disk: for processing of its data, in addition to its various 0, 1 and 2-cells, it also contains relational information among these cells. Thereby it is possible to establish the topology of the network.

Table I (TAB1) shows a memory table in which the data of section A shown in FIG. 1 is stored. The first column contains a list of all 1-cells. The 1-cells are stored sequentially and each 1-cell represents an address for a memory location. For each 1-cell there is also stored a first and a second 0-cell, being its starting point and the terminating point, respectively. For example, the 0-cells 1 and 3 are included as the first and the second 0-cell, respectively, for the 1-cell c. Preferably, the 0-cell having the smallest X coordinate value (leftmost) is selected as the starting point. Furthermore, for each 0-cell there is included a so-called thread pointer t.p. Such a thread pointer indicates a further 1-cell having the 0-cell in common with the original 1-cell. Taking that 0-cell as an origin, the thread pointer indicates the "next" 1-cell that is found by rotating clockwise from starting at the original 1-cell. Furthermore, the thread pointer contains an indication of the associated section. The assignment of thread pointers has been described in "A tiger for tomorrow" by R. H. Moore, Conference Proceedings of "Joint symposium for urban data management systems and the spatially oriented referencing systems association" (June 3, 1985, the Hague, the Netherlands). This paper also describes how the 0-cell lists of the network can be established. For example, for 1-cell c and 0-cell 3, the associated thread pointer indicates the 1-cell f in the section A. When the 1-cell f is addressed, the thread pointer assigned to (f,3) (this notation hereinafter indicates a combination of 1-cell and 0-cell) indicates the 1-cell g The thread pointer assigned to (g,3) indicates the 1-cell e, and the thread pointer assigned to (e,3) indicates the 1-cell c again. Thus, table I indicates that the 0-cell 3 joins 1-cells c, f, g and e; 0-cell 3 is the terminating point of 1-cells c and e and the starting point of 1-cells f and g in section A Tables II, III and IV are composed in the same way as the table I and relate to sections B, C, D, respectively. At the intersection of a 1-cell and an intersection boundary a notional 0-cell is placed. Thread pointers assigned to such notional 0-cell indicate the same 1-section lying in the adjoininq section. If the adjoining section is not shown in the figure, the thread pointer has a dash. In similar way tables Va..Vd start from the 0-cells for the respective sections A, B, C, D. Each 0-cell entry has thread pointers that represent the 1-cells starting or terminating in that 0-cell and also the section where these 1-cells are situated. For a notional 0-cell the latter section is the one across the boundary. A storage organization as described can be used for planning a route through the network from a starting point to a destination point. Such a device will be described hereinafter, for vehicle navigation.

Figure 2:
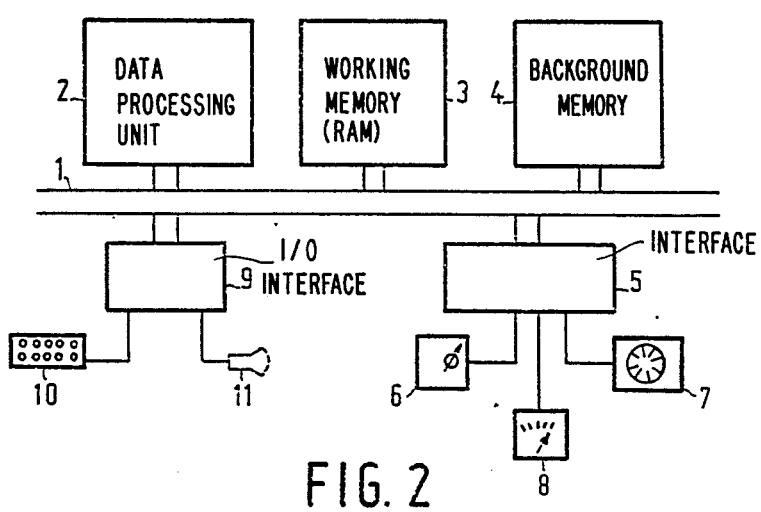
FIG. 2 is a block diagram of a vehicle naviagion device.

FIG. 2 shows the major components of such a device. The device comprises a bus 1 to which a data processing unit 2, a working (RAM) memory 3 and a background memory 4 are connected. The latter contains from example an optical disc, which stores map data, navigation data and other control data. The map data is organized as shown in tables I to IV. To the bus 1 there is connected a first interface 5 for attachment of electromagnetic compass 6, wheel sensors 7 and odometer 8. The elements 6, 7, 8 sense information determined by the actual vehicle position or the changes thereof. Calculation of the position itself therefrom has been described in the "EVA-Ortungs- und Navigationssystem für Landfahrzeuge" by E. P. Neukirchner et al., in Nachrichtenzeitschrift Bd 36 (1983), Vol. 4, pages 214–218. For brevity, such calculation is not discussed further. A keyboard 10 and a display element 11 are connected to a second input/output interface 9. The keyboard 10 is used for inputting starting point and destination point data. The display element 11 is formed, for example by a cathode ray tube, L.C.D. element, or, alternatively by a loudspeaker.

During operation, the data processing unit calculates the actual position coordinates of the vehicle. These are used for determining the position with respect to the network, while compensating for errors accrued in the earlier calculation. Such determination is known from PCT patent application WO 86/00157.

The same data processing subsystems 1, 2, 3, 4 are used in determining a navigation route between user-defined starting and destination points, as follows. First, the route planner translates the coordinates of the starting point and the destination point into associated 0-cells and/or 1-cells in order to address an associated location in background memory. From these, the route planner determines a set of n-cells that constitute the route. Searching for this set has been described in "A note on two problems in connection with graphs" by E. W. Dijkstra, Numerical Mathematics, Vol. 1, 1959, pages 269-271. The planning of a route is based on finding a so-called expansion index that indicates a particular n-cell (in the principal example a 1-cell), that is to be traversed in a certain direction. At the down-end of this 1-cell, other 1-cells having the same terminal point (0-cell) in common therewith, constitute a set of candidate 1-cells. Each of the latter 1-cells is indicated then by a new expansion index, from which per 1-cell a new set of candidate cells is found. This search process continues until a route has been determined between starting point and destination point. For each candidate cell the device must memorize in which working memory location information related to this candidate cell is stored in order to fetch the various n-cells forming the route from the working memory when the planning of the route has been completed.

THE ORGANIZATION OF THE STORAGE

The address sequence of the n-cells in the working memory is fixed and runs in the same direction as in the background memory tables. This facilitates address translation.

FIG. 3 shows the storage organization of the section B 1-cells in the working memory. In addition to an indication of the 1-cell in question (f, x, y, z), for each 1-cell an information block can be stored adjoining thereto. When realizing the route planning by means of 0-cells, five memory addresses would be reserved for section B (table V-b). Preferably, the storage space allocated to each entry has a uniform capacity. When operating on the basis of 1-cells, the space allocated to the information block of the associated 1-cell is divided into two parts If the planned route traverses the 1-cell in question in the same direction as the one chosen for drafting the 1-cell table, the information block relating to the 1-cell is stored in the + part of the storage space. In the opposite case, the — part is used. For each candidate 1-cell, each part contains:

KAV: this indicates the actual section. This is important notably when the n-cell traverses a plurality of sections.

n-cl: therein the expansion n-cell is stored, which has led to the finding of the present candidate n-cell.

DIR: (applicable only if route planning is executed on the bais of 1-cell tables). This gives the direction in which the expansion 1-cell must be traversed in order to reach the candidate 1-cell, relative to the direction used in drafting the 1-cell table.

G: this is the so-called cumulative resistance value. This is calculated as the sum of the lengths of the various, already travelled road segments, incremented by the sum of the so-called "deflection" resistance values related to the road covered already. A deflection resistance value of an intersection, such as a crossing point, is given by the direction in which that intersection is traversed. For example, for right-hand traffic, a resistance value $R_1$ relates to crossing straight-on; $R_2$, $R_3$ are assigned for right and left turns, respectively, where $R_1 < R_2 < R_3$.

H: this is a destination resistance value. This is defined as the geographical distance between the point reached and the destination point.

DESCRIPTION OF AN OPERATIONAL SEQUENCE

Figure 4:
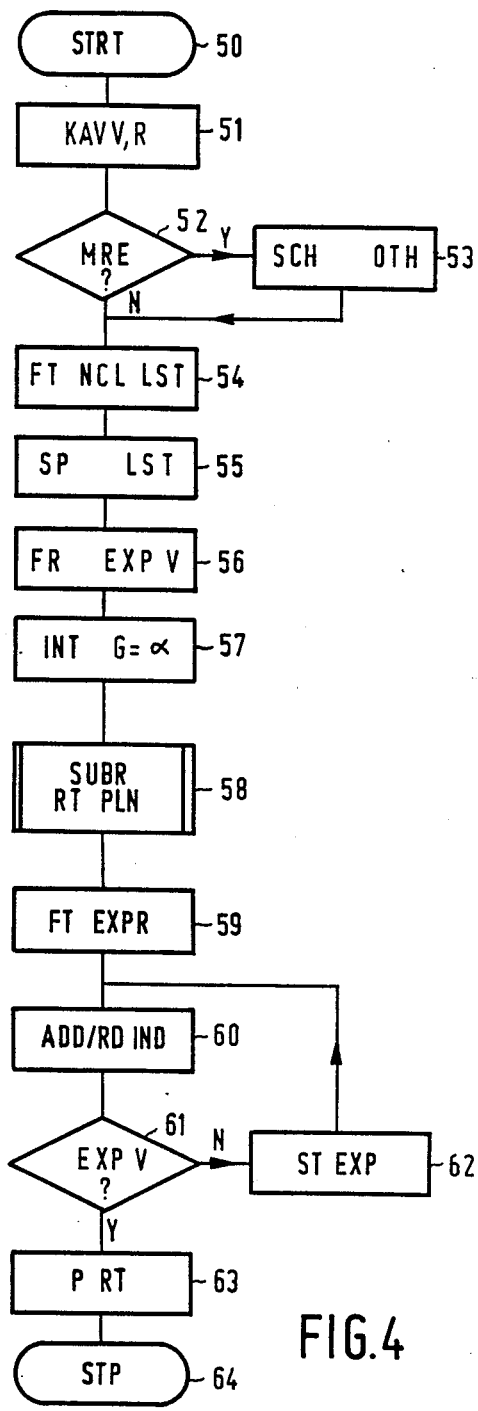
FIG. 4 shows a flowchart of a route planning program.
Figure 5:
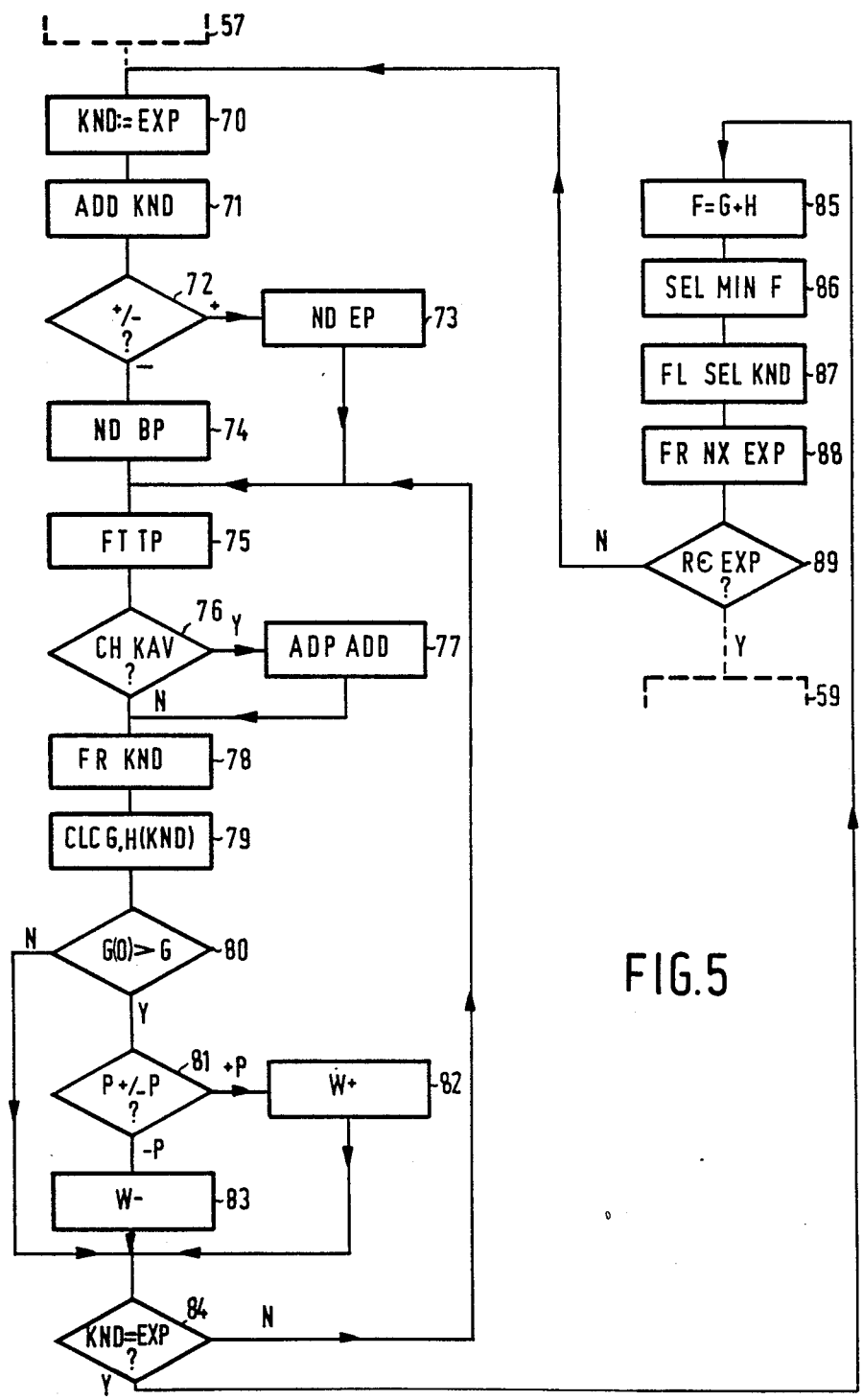
FIG. 5 shows a flowchart of a subroutine thereof.

FIGS. 4, 5 represent a flowchart of an operational example. After initialization (50), the process comprises the steps:

51 KAV V R: first, the system determines in which sections the starting and destination points are situated. This procedure is known from "CAR Guide on board computer for automobile route guidance", cited earlier.

52 MRE?: in this step it is checked whether more than two sections must be examined in order to plan a route between V and R.

53 SCH INT: if positive, the additional sections are identified.

54 FTNCL LST: now, the n-cell list or lists of all those sections are fetched from the background memory.

55 SP LST: for each of these sections an amount of working memory is reserved for the storage of expansion indices. For each section, the amount of space is determined by the number of n-cells of its n-cell list. Therefore, an adequate number of memory addresses are reserved therefor. The address sequence preferably is the same as the one used in the n-cell table. Preferably, at the addresses thus formed the contents of the n-cell lists are also stored.

56 FR EXPV: now, a first expansion index (EXPV) is formed which comprises at least the parts <KAV, n-cell> of an information block. The first expansion index is formed from the section indication and the n-cell indication of the starting point V. Furthermore, an initialization index is written at the address reserved for the n-cell indicated by the expansion index.

57 INT G=α: at the memory location reserved for each n-cell, with the exception of the n-cell indicated by the first expansion index, an initialization value for G is stored. This will be described in detail hereinafter.

58 SUBR RTPLN: in this subroutine a set of candidate cells is determined on the basis of the first expansion index. From these candidate cells a further expansion index is selected. The formation of candidate cells on the basis of an expansion index is repeated until a candidate cell is found on which the destination point is situated. The first and further expansion indices then form a set wherefrom the route is found. This subroutine will be described with reference to FIG. 5.

59 FT EXP R: after the execution of the route planning subroutine, the expansion index (EXP R) which indicates the n-cell at which the destination point R is situated is fetched.

60 ADD/RD IND: the working memory address of the n-cell indicated by the relevant expansion index is formed and the information block stored at this address is fetched.

61 EXP V?: it is checked whether the expansion index of the information block fetched during the preceding step is the same as the first expansion index (EXP V). This is because all n-cells of the route to be planned are known when the first expansion index is reached again.

62 ST EXP: when the first expansion index has not yet been reached, the n-cell indicated by the relevant expansion index is stored in a buffer.

63 P RT: when the first expansion index is reached, the planned route is presented to a user in the form of the n-cells stored in the buffer.

64 STP: end.

The program begin with the starting point. The opposite direction would be feasible as well.

FIG. 5 shows a flowchart of an example of a route planning subroutine, on the basis of 1-cells whereto each time a direction is assigned.

70 KND:=EXP: the actual expansion index is taken for finding a candidate cell.

71 ADD KND: the address of the location in the 1-cell list in the working memory is accessed and its information fetched.

72 +/−?: it is checked whether the expansion index cell is traversed in an equal or opposite direction to its assigned direction.

73 ND EP: when the two directions are equal, the terminal point of the indicated 1-cell is selected for the next step (75).

74 ND BP: in the opposite case, the starting point is selected.

75 FT TP: the thread pointer of the selected point is fetched.

76 CH KAV?: for this thread pointer it is checked whether it is assigned to a notional 0-cell.

77 ADP ADD: if yes, the 1-cell crosses a section boundary. The address generator must form addresses for the next section.

78 FR KNN: using the thread pointer from step 75, a further candidate cell is found and the address therefor is formed, and also the so-called parent pointer. The latter contains the section and 1-cell indications and the direction in which the candidate 1-cell is traversed.

79 CLC G, H(KND): for the candidate cell found during the preceding step, the G and H values are determined.

80 G(0)>G?: this G value is compared with the applicable G value present at the address formed during the step 78. If the new G value is higher, the associated 1-cell forms part of an inattractive route because of its high resistance for correct operation, the G values were initialized to a high value during step 57 (FIG. 4).

81 +P/−P: if the new value of G is lower than the one already stored in the applicable part of the reserved space, it must be written therein. If the direction of travel and the assigned direction are equal, the + part applies, otherwise the − part.

82/83 W+/−: the expansion index and the G values and the H values are written at the applicable part.

84 KND=EXP?: it is checked whether the candidate cell found is the same as the 1-cell indicated by the expansion index itself. If this is the case, the set of candidate cells chained to the actual expansion index is complete so that a further expansion index may be selected. Otherwise the program returns to step 75 in order to find a further candidate.

85 F=G+H: the evaluation value F, being equal to the sum of the G and the H values, is now determined for all candidate cells found. This value F determines the usefullness of the candidate cell in finding an optimum route.

86 SEL MIN F: from all candidate cells which have not yet resulted in an expansion index, that one having the lowest evaluation value F is selected, because it refers to a 1-cell which most likely belongs to the optimum route. The selected candidate cell now forms the basis for the formation of a further expansion index.

87 FL SEL KND: the selected candidate cell is now marked in order to memorize that it has resulted in an expansion index (important for the selection procedure of the step 86).

88 FR NX EXP: on the basis of the selected candidate cell, the actual expansion index <KAV, 1-cell, DIR> is formed 89 RE EXP?: it is checked whether the destination point R belongs to the 1-cell indicated by the actual expansion index. If this is the case, the program proceeds to step 59 of the route planning program if not, the subroutine is repeated.

DESCRIPTION OF AN ACTUAL ROUTE FINDING EXAMPLE

Figure 7:
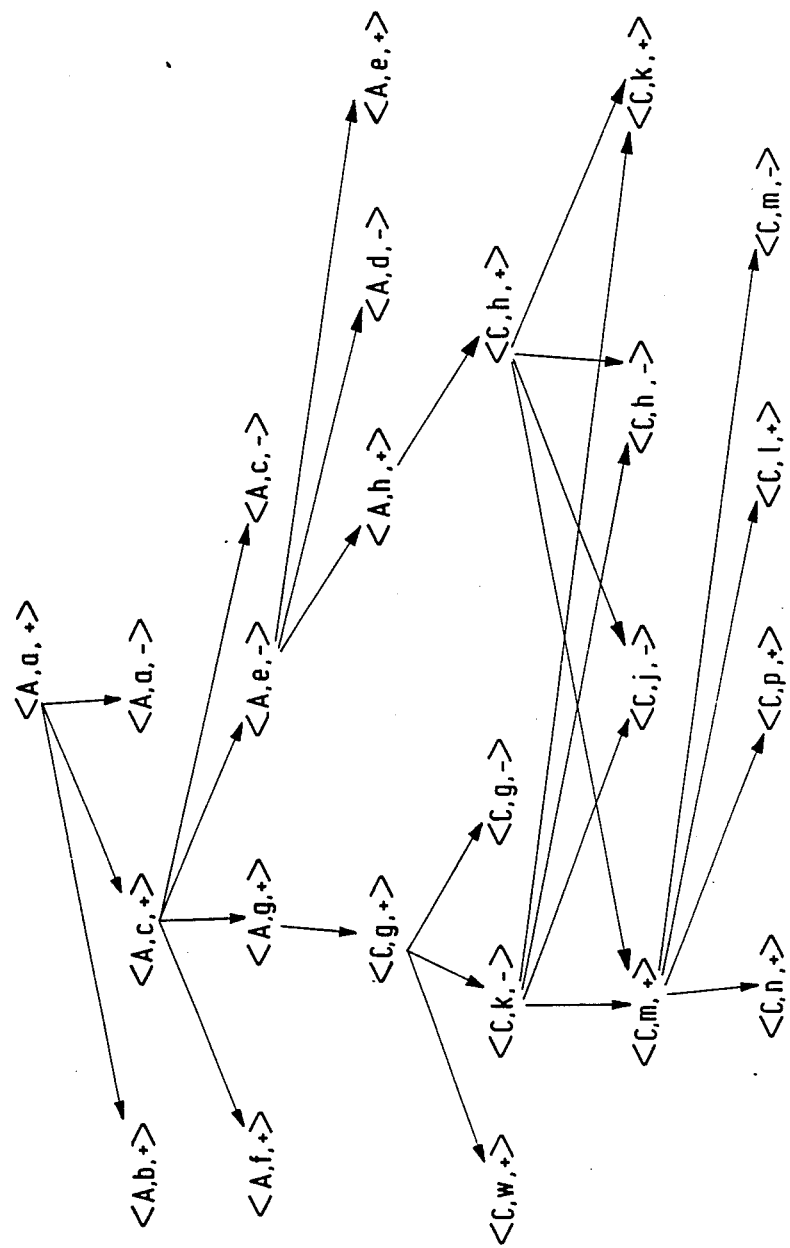
FIG. 7 shows a tree structure of the parent pointers for the above.

Assume that an optimum route between points V on 1-cell a and R on 1-cell p in FIG. 1 must be found. In this example, only the 1-cell lists of sections A, C are fetched from background memory. A particular advantage of using 1-cell lists is that it would be straightforward to accommodate additional memory space for storing information blocks to their associated 1-cell, because the sequence of the 1-cells is already present in background memory. In FIG. 6, the five leftmost columns illustrate the contents of the relevant part of the working memory as fetched from background memory. Initially, the rightmost columns are reserved for storing the associated information blocks. FIG. 7 shows a tree structure of the various parent pointers for the present example.

The starting point V is situated on 1-cell a in section A, so <A, a, +> is the first expansion index (EXPV). The direction DIR = + considered to be given. At the memory location reserved for the 1-cell a the initialization index *** is written in the + part, which indicates that the starting point lies on this 1-cell. The values G=0, H=85 are also calculated and written at the address (A,a); G=0 means that this is the beginning of the route, H=85 may be measured from the map. (The initialization of the G value has not been shown in FIG. 6). Because DIR=+, the 1-cell a is traversed from starting point to H terminal point, so that the terminal point of the 1-cell a, being the 0-cell 1, must be considered (steps 72, 73, FIG. 5). The thread pointer of (a,1) indicates 1-cell b for which parent pointer <A, b, +> (FIG. 7) is determined. The parent pointer has the direction DIR=+, because the 0-cell 1 is the starting point of the 1-cell b. If necessary (step 80) an information block may be stored at the + part of the working memory space for 1-cell b, section A (steps 81 and 82). In the present example, G=60 and H=100 (these values merely serve for the purpose of illustration). Because G=60<α, the initialization value (step 80), the information block is written to contain <A, a, +, 60, 100 >.

Next, the thread pointer assigned to (b,1) is fetched from the address (A,b). This thread pointer indicates the candidate 1-cell c. The parent point for the candidate 1-cell c is <A, c, +> and the values G=20, H=70 are determined. Because the value G=20 <α, the information block <A, a, +, 20, 70 > is written at the + part (the 0-cell 1 is the starting point of the 1-cell c) of the memory address (A,c) reserved for the 1-cell c in the section A. Next, the thread pointer assigned to (c,1) indicates the candidate 1-cell a in the section A. For the candidate 1-cell a the values G=20, H=105 are determined and the parent pointer is <A, a, −>. The value G=20 is smaller than the initialization value so that a change-over is made to the step 81 of the route planning subroutine. Furthermore, 1-cell a should now be traversed opposite to its assigned direction. Thus, the information block <A, a, +, 20 105 > is written in the − part of the memory location reserved for the 1-cell a.

Because candidate 1-cell a then corresponds to 1-cell a indicated by the expansion index <A, a, +> (step 84), a change-over is made to step 85 for determining the evaluation value F. For the information blocks stored at the addresses (A,b), (A,c) and (A,a), the F values are:

$F(b) = 60 + 100 = 160$ $F(c) = 20 + 70 = 90$ $F(a) = 20 + 105 = 125$

Because candidate 1-cell c has the smallest F value (step 86), <A, c, +> is chosen as the further expansion index. The destination point R is not situated at the 1-cell, so that (step 89 N) the route planning subroutine is repeated with expansion index <A, c, +>. Next, thread pointer of (c,3) is fetched for indicating candidate 1-cell f, section A. For this, values G=60, H=90 are determined. Thus, information block <A, C, +, 60, 90 > is written, at the + part of the working memory address reserved for the 1-cell f, in section A. Furthermore, parent pointer <A, f, +> is formed as shown in FIG. 7.

Next, the thread pointer assigned to (f,3) indicates the candidate 1-cell g in the section A. The values G=40, H=55 are determined and the information block <A, C, +, 40, 55 > is written at the + part of the working memory address reserved for the 1-cell g in the section A. The parent pointer is <A, g, +>.

The thread pointer assigned to (g,3) not indicates candidate 1-cell e that has values G=30 H=80. Therefore, the information block <A, c, +, 30, 80 > is written at the − part of the working memory location assigned to the 1-cell e. The parent point is <A, e, −>.

The thread pointer assigned to (e,3) indicates the candidate 1-cell c in the G=40 and H=90, so that information block <A, c, +, 40, 90 > is written at the − part of the memory location reserved for the 1-cell c in the section A. <A, c, −> is the parent pointer.

The 1-cell c is then the same as the 1-cell indicated by the expansion index <A, c, +>, so that from the set of candidate 1-cells which have not resulted in an expansion index there must be selected a further expansion index. The evaluation value F is determined for candidate 1-cells f, g, e and c (step 85), and $F(f) = 60 + 90 = 150$ $F(g) = 40 + 55 = 95$ $F(e) = 30 + 80 = 110$ $F(c) = 40 + 90 = 130$ the candidate having the minimum value is determined from all candidates which have not yet resulted in an expansion index, i.e.

<A, b, +>, F=160

<A, a, −>, F=125

<A, f, +>, F=150

<A, g, +>, F=95

<A, e, −>, F=110

<A, c, −>, F=130

The evaluation value F=95 associated with candidate 1-cell g is the smallest. Therefore, the further expansion index will be <A, g, +>. Upon addressing 1-cell g, it is found that its terminal point 24 is a notional point and its thread pointer (g,24) indicates 1-cell g in section C. Thus, the address generator will address a location assigned to section C, and notably (g,C), which will get information block <A, g, +, 60, 40 > at the + part thereof (equal directions). The parent pointer is <C, g, +>.

During the step 84 it is found that candidate 1-cell g corresponds to 1-cell g indicated by the expansion index <A, g, +>.

The evaluation value $F(g) = 60 + 40 = 100$ is then determined which obviously is the lowest among the candidates that have not yet resulted in an expansion index. This demonstrates the advantage of the use of notional 0-cells, because the crossing of a section boundary can be simply indicated in this manner and, because notional 0-cells need no specific program adaptation. For this 0-cell, candidate cell w yields the information block <C, g, +, 80, 45 > for the + part of address (w,C) and parent pointer <C, w, +>; candidate cell k yields the information block <C, g, +80, 25 > for the − part of address (k, C) and parent pointer <C, k, −>; candidate cell g yields information block <C, g, +70, 55 > at the − part of its memory location, and parent pointer <C, g, −>.

The next expansion index is based on parent pointer <C, k, −>, because it has the lowest F value 105. Branching point 4 yields <C, k, −, 100, 5 > for the − part of cell m, <C, k, −, 105, 20 > for the − part of cell j, <C, k, −, 95, 30 > for the − part of cell h, and <C, k, −, 100, 40 > for the + part of cell k. The parent pointers are <C, j, −>, <C, h, −>, and <C, k, +>.

At this instant, the F values are recalculated and <A, e, −> has the lowest value (110) versus 115 for <C, m, +>. Thus, for the moment the route via 1-cells g,k is no longer examined, as it is apparently less attractive. In principle, this decision could be overturned again later.

Expansion index <A, e, −> yields the information block <A, e, −, 75, 35 > for the + part of cell h and parent pointer <A, h, +> and the information block <A, e, −, 60, 70 > for the + part of cell e (cell d will obviously be unsuccessfull). Calculation of all F values shows the lowest to be related to <A, h, +>:110. This yields information block <A, h, +, 85, 25 > for address (C,h), + part and parent pointer <C, h, +>, while crossing the boundary to section C. Thereafter <C, h, +> has the smallest F value.

Branching from 0-cell 4 yields information block <C, h, +, 95, 40 > for the + part of memory location (k,C). This information replaces the information present at that position because the new G value (95) is lower than the old one. FIG. 6 shows the new information below the old one. The new parent pointer is <C, k, +>. In corresponding manner, information block <C, h, +, 105, 5 > replaces the earlier information at address (m,C), because the old F value was 110, and information block <C, h, +, 90, 30 > replaces the old information at address (h,C), − part: parent pointer <C, h, −>.

The next expansion index, determined rom 1-cells that have not yet yielded an expansion index, is <C, w, +> with F value 110. Expansion as from 0-cell 5, among other results, gives information block <C, m, +, 110, 0 > at the − part of address (p,C), parent pointer <C, p, +>. The results for l, m, n, show in FIG. 6. The 1-cell p has the smalles expansion index: <C, p, +>:F=110. Moreover, destination point R is situated on this 1-cell p. The step 89 of FIG. 5 gives a positive result and the subroutine is exited.

Next, the route itself is found, starting from the last selected expansion index <C, p, +>. From this information, the + part of cell p in section C is addressed; successively backtracking through the information of FIG. 6 then first yields expansion indices <C, m, +> and <C, h, +>. The latter + part contains <A, h, +>, and via notional 0-cell 25 a smooth transition is made to the memory part reserved for the A section. Further backtracking yields: <A, e, −>, <A, c, +>, <A, a, +>. The latter contains starting point V and the route is found by reversing the string of 1-cells found: (a, c, e, h, m, p).

The advantage of ihe organization of the working memory is thus clear: maintaining the sequence as given in the 1-cell table, makes the finding of the memory locations is elementary, because the address can be derived directly from the expansion index. It is always apparent at which address the information blocks must be written: they are stored directly at their respective 1-cell; no separate address table is necessary.

For completeness, route planning on the basis of 0-cells, will now be described with reference to an example, wherein a route is planned between 0-cell 1 and 0-cell 2 in FIG. 1. The flowcharts of FIGS. 4 and 5, are used, be it without the steps which relate to the direction.

FIG. 8 shows the result of loading the 0-cell list for section A. Now, starting from 0-cell 1, information block <a, *, 0, 25 > is written at the address (a,A) (the 0-cell indication will also be used as the address). Furthermore, the G values are also initialized. In subroutine 58 the thread pointer of 0-cell 1, first indicates 1-cell c, bounded by 0-cell 3 that is thus a candidate 0-cell. Consequently, information block <A, 1, 20, 20 > is written at the address (3,A) in the working memory. The parent pointer <A, 3 > is formed as indicated in FIG. 9.

In the same manner candidate cell 21 leads to information block <A, 1, 60, 70 > written at address (21,A), parent pointer (A,21), and candidate cell 11 to information block (A,1,20,55) at address (11,A). The lowest F value applies to <A, 3 >:40, that will be the next expansion index. In the same manner, candidate cell 2 leads to the information block <A, 3, 40, 20 > at address (2,A), parent pointer <A, 2 > with the lowest F value: F=40. Also, the destination is now reached. Starting from address (A,2) the backtracking is elementary and yields, after inversion, the route (1, 3, 2).

In addition to other advantages, the invention has a very economical use of the working memory capacity. Even though FIGS. 6, 8 show that some memory space has remained unused, the use of the invention still saves memory space because less overhead information need to be stored. For example, information blocks may use 5 bytes for the expansion index, 4 bytes for the G value and 4 bytes for the H value. Therefore, in total 13 bytes are used per candidate cell. FIG. 10 shows a graph in which the number of candidate cells examined is plotted along the horizontal axis and the memory capacity used, expressed in bytes, is plotted along the vertical axis. The horizontal line (100) at 13 bytes represents the memory capacity used when use is made of the invention. According to the known method, each candidate not only requires these 13 bytes but also 5 bytes for indicating the candidate itself, 5 bytes for the related index, i.e the index referring back to the 0-cell associated with the expansion index, and 5 bytes for the index of origin which indicates, starting from the 0-cell of the expansion index, the indicated 0-cell. Therefore, a total number of 28 bytes are required per candidate cell as represented by the oblique line 101 in FIG. 10. From these data the point of intersection of the lines 100 and 101 can be determined as follows:

$$\frac{x}{13} = \frac{1}{28} => x = 0.46.$$

Therefore, each candidate cell requires only 46% of the memory space required according to the known method.

What is claimed is:

1. A planner device for planning a route through a topological road network, comprising:

background memory means for storing said network as a set of n-cell tables (n=0.1) of road segments or junctions;

random access working memory means for storing a subset of said set of n-cell tables as actually used in said planning;

address assigning means for assigning a respective first working memory address to each entry of each n-cell table used in planning the route;

data processing means coupled to said working memory means comprising:

expansion means for pointing to a set of candidate n-cells for said route, starting from one end of the route until the other end of the route is reached, on the basis of an actual expansion index indicating an actual n-cell;

linking means for linking each first working memory address pertaining to a candidate n-cell pointed to by said expansion means, to a second working memory address containing the n-cell used for said pointing;

evaluation means for assigning an evaluation value to each candidate n-cell pointed to by the expansion means;

selection means for selecting a candidate n-cell having the most advantageous evaluation value among those that have not led to an expansion index, repeat control means for repeatedly activating said expansion means, said evaluation means and said selection means until said other end of the route is reached, and backtracking means activated by said repeat control means for backtracking a linked set of candidate n-cells starting from the n-cell containing said other end until said one end is reached, said linked set constituting said route.

2. The device as claimed in claim 1, wherein each n-cell table of said subset of said set of n-cell tables has identical n-cell sequence in said working memory and in said background memory.

3. The device as claimed in claim 1, wherein said n-cell tables comprise 1-cells being traversable in a first and in a second direction, and said linking means comprises means for linking each candidate n-cell of the set of candidate n-cells pointed to by said expansion means to a third working memory address containing a further n-cell used for said pointing, said second and third working memory address relating to said first and second directions, respectively.

4. The device as claimed in claim 1 wherein said first working memory address contains the address of each n-cell used for said pointing.

5. The device as claimed in claim 1, wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the new n-cell used for the pointing.

6. The device as claimed in claim 3 wherein said first, second and third working memory addresses are contiguous.

7. The device as claimed in claim 1, in which the road network is subdivided into sections and in which at least one n-cell table is stored in the working memory for each section, comprising verifier means for determining whether a candidate n-cell crosses a section boundary and for generating a crossing signal and in which said address assigning means is responsive to said crossing signal for assigning addresses to the n-cells of the further section.

8. The planner device as claimed in claim 1 included in a vehicle navigation device.

9. The device as claimed in claim 2, wherein said n-cell tables comprise 1-cells being traversable in a first and in a second direction, and said linking means comprises means for linking each candidate n-cell of the set of candidate n-cells pointed to by said expansion means to a third working memory address containing a further n-cell used for said pointing, said second and third working memory address relating to said first and second directions, respectively.

10. A device as claimed in claim 2 wherein said first working memory address contains the address of each n-cell used for said pointing.

11. A device as claimed in claim 3 wherein said first working memory address contains the address of each n-cell used for said pointing.

12. A device as claimed in claim 9 wherein said first working memory address contains the address of each n-cell used for said pointing.

13. A device as claimed in claim 2 wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the new n-cell used for the pointing.

14. A device as claimed in claim 3 wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the new n-cell used for the pointing.

15. A device as claimed in claim r wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the new n-cell used for the pointing.

16. A device as claimed in claim 9 wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the n-cell used for the pointing.

17. A device as claimed in claim 10 wherein the working memory address containing any n-cell used for said pointing to an actual expansion index also contains an actual value of said evaluation value and wherein said linking means is responsive to said evaluation means for linking only if an updated evaluation value is more advantageous than a stored evaluation value, for replacing the latter in conjunction with storing the new n-cell used for the pointing.

* * * * *